United States Patent [19]

Norwood et al.

[11] Patent Number: 4,636,987

[45] Date of Patent: Jan. 13, 1987

[54] SEMICONDUCTOR DYNAMIC MEMORY DEVICE WITH MULTIPLEXED SENSE AMPLIFIER AND WRITE-ACTIVATED ACTIVE LOADS

[75] Inventors: Roger D. Norwood, Sugar Land, Tex.; Chitranjan Reddy, Sunnyvale, Calif.

[73] Assignee: Texas Instruments, Dallas, Tex.

[21] Appl. No.: 645,581

[22] Filed: Aug. 29, 1984

[51] Int. Cl.$^4$ ............................................. G11C 7/02
[52] U.S. Cl. .................................. 365/208; 365/205; 365/189
[58] Field of Search ............... 365/205, 207, 208, 210, 365/203, 189

[56] References Cited

U.S. PATENT DOCUMENTS 4,233,675 11/1980 Karp et al. ........................... 365/205
4,366,559 12/1982 Misaizu et al. ...................... 365/205
4,370,575 1/1983 McAlexander, III .......... 365/205 X Primary Examiner—Joseph A. Popek
Attorney, Agent, or Firm—John G. Graham

[57] ABSTRACT

A semiconductor dynamic memory device contains differential sense amplifiers for detecting the charge on bit line halves which are of the folded type. The sense amplifiers are multiplexed so that one of two opposite pairs of bit line halves are selected. The two opposite pairs share precharge and active pull-up circuits on one side of the array, and share column output lines on the opposite side. Thus, the multiplex circuitry operates not only for selecting one side or the other for sensing, but also for coupling precharge and boost voltages or read/write data back and forth from one side of the sense amplifier to the other. The active pull-up circuits are activated in both read and write portions of a read-modify-write cycle.

12 Claims, 7 Drawing Figures

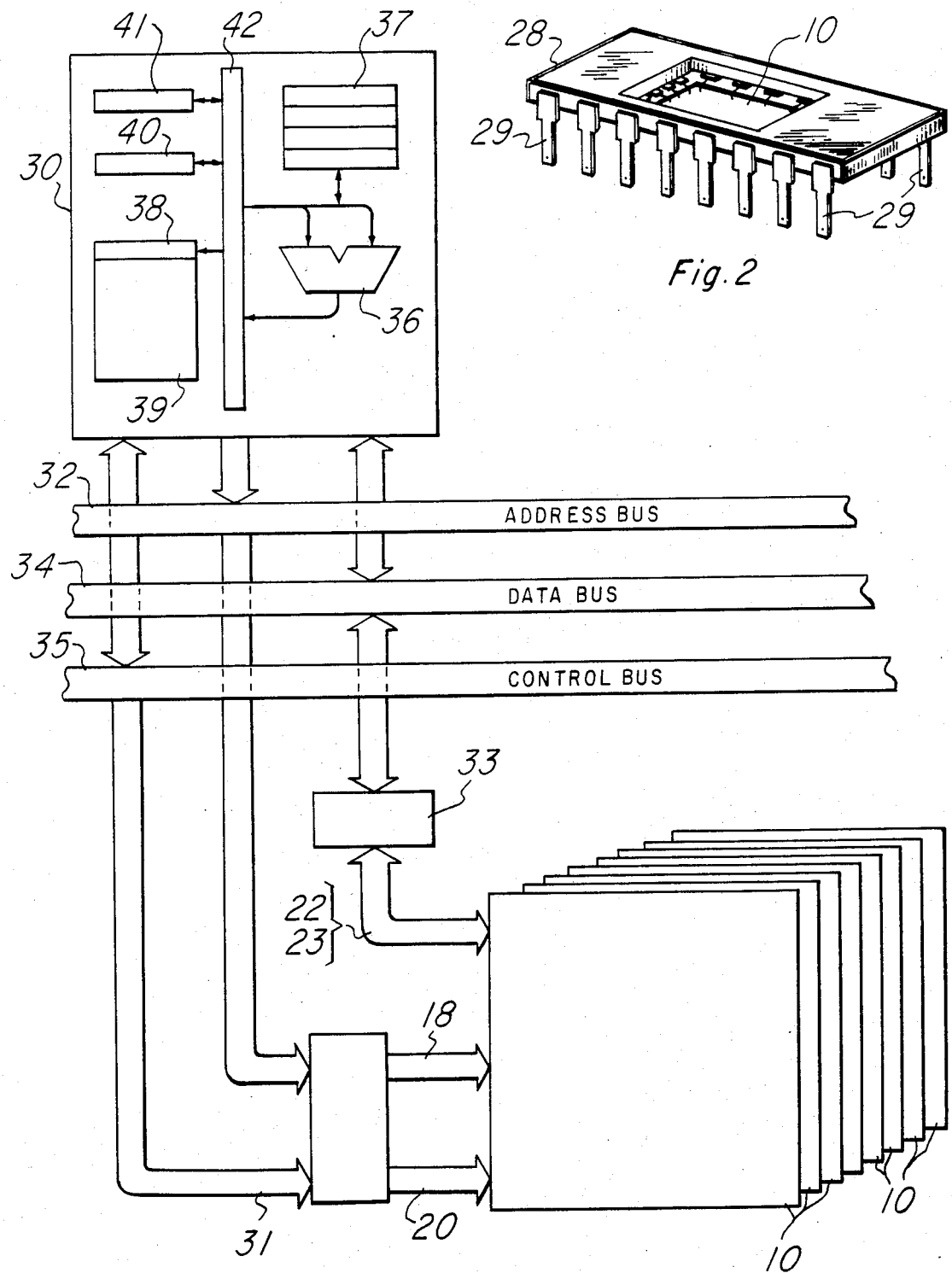

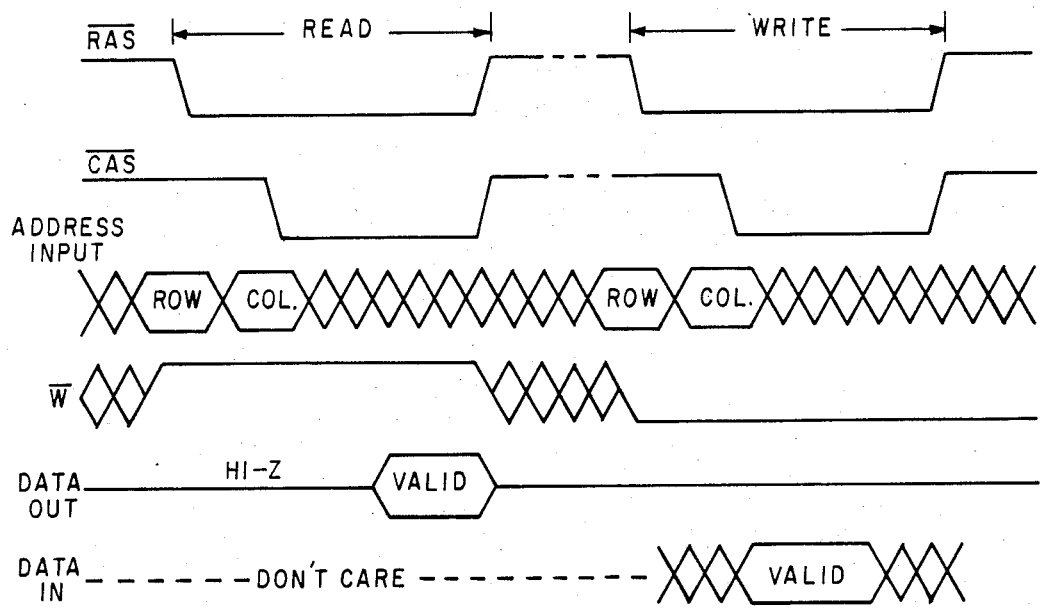
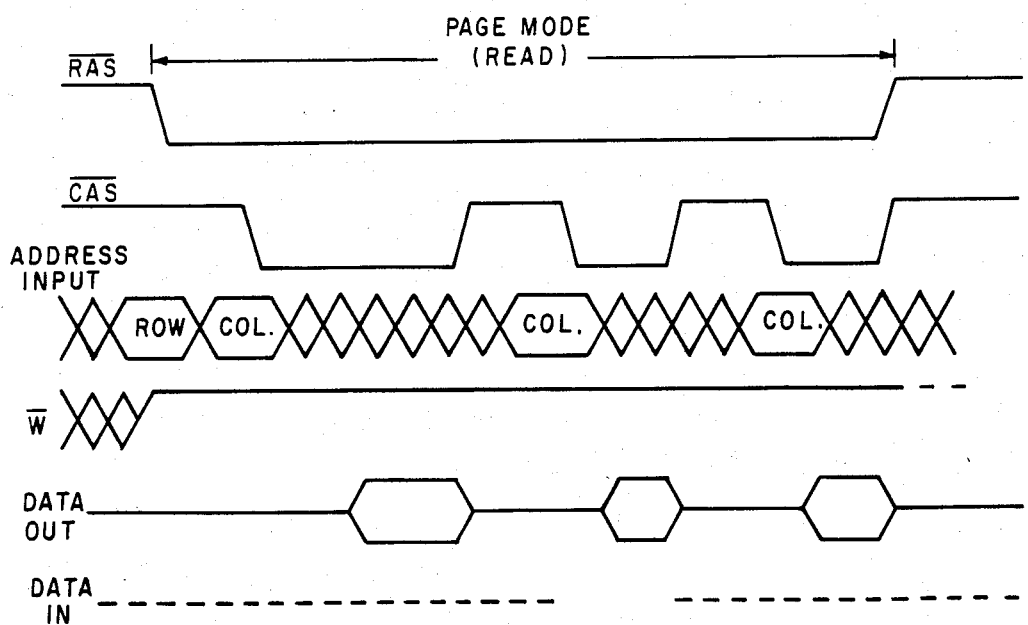
Fig. 3a

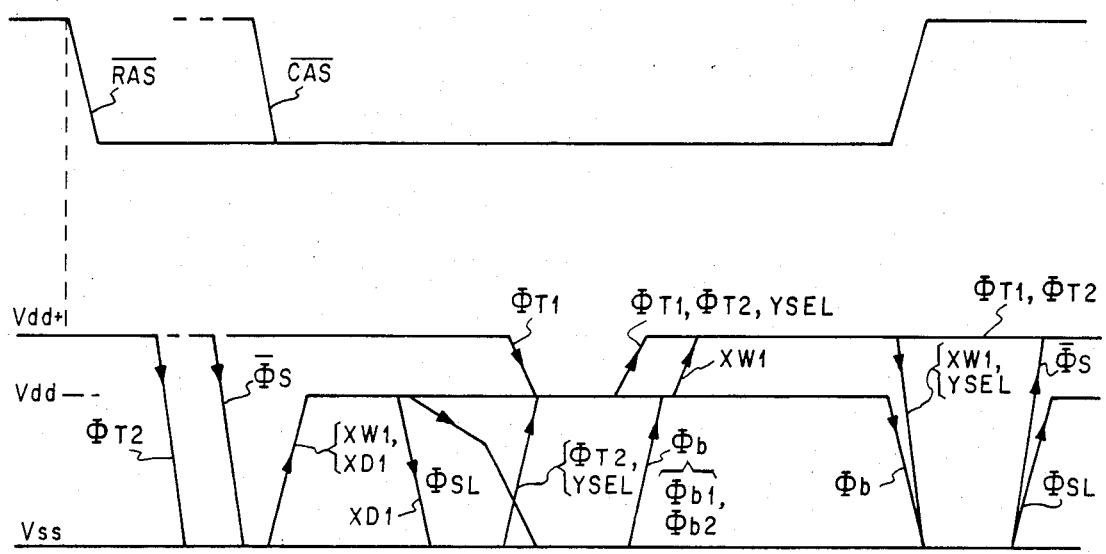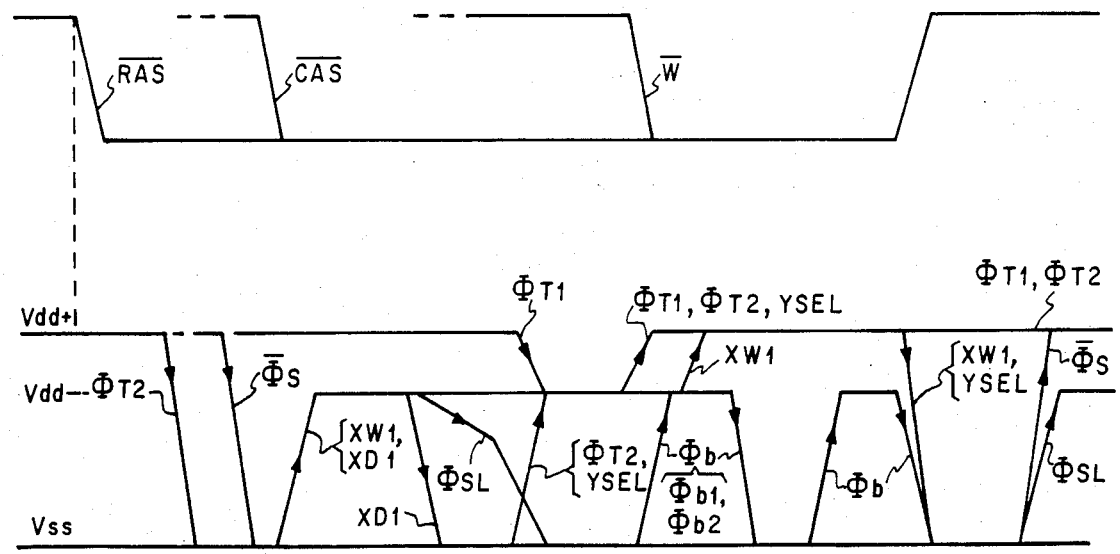
Fig. 6

SEMICONDUCTOR DYNAMIC MEMORY DEVICE WITH MULTIPLEXED SENSE AMPLIFIER AND WRITE-ACTIVATED ACTIVE LOADS

BACKGROUND OF THE INVENTION

This invention relates to semiconductor memory devices and more particularly to an improved high-density MOS random access, dynamic read/write memory.

One of the most widely used memory devices for computers is the MOS dynamic RAM of the 64K-bit size illustrated in U.S. Pat. No. 4,239,993, issued to McAlexander, White and Rao, assigned to Texas Instruments. As memory density increases to the 256K-bit and 1-Megabit sizes, the number of storage cells connected to a single bit line half would also increase. With an increased number of cells, the bit line capacitance would also increase. Because of upper limits on the chip size, the storage cell capacitance has tended to remain relatively constant, or possibly decrease. Since the signal available on the bit lines for sensing is a direct function of the ratio of the storage cell capacitance to the bit line capacitance, this signal would also tend to decrease with increasing cell density. One solution to this problem is to use a more sensitive sense amplifier, but increased sensitivity demands increased sensing time, and also the smaller signal increases probability of alpha-particle induced soft errors. Another solution is to reduce the number of cells on a bit line and to share a sense amplifier between two pairs of bit line halves, requiring isolation of the halves not being read from. Along with this multiplexed or shared sense amplifier scheme comes problems with data propagation time through the sense amplifier, particularly during a "write" cycle.

It is the principal object of this invention to provide an improved high-speed, high density, dynamic random access memory, particularly for multiplexed sense amplifier configuration. Another object is to provide a semiconductor dynamic memory device which uses multiplexed sense amplifiers with no speed penalty. A further object is to provide an improved shared sense amplifier type of dynamic RAM circuit which overcomes difficulties in write cycle timing, and in writing a full supply level into the selected storage cell.

SUMMARY OF THE INVENTION

In accordance with one embodiment of the invention, a semiconductor memory device contains differential sense amplifiers for detecting the charge on bit line halves which are of the folded type. The sense amplifiers are multiplexed so that one of two opposite pairs of bit line halves are selected. The two opposite pairs share precharge and active pull-up circuits on one side of the array, and share column output lines on the opposite side. Thus, the multiplex circuitry operates not only for selecting one side or the other for sensing, but also for coupling precharge and boost voltages or read/write data back and forth from one side of the sense amplifier to the other. The active pull-up circuits are activated in both read and write portions of a read-modify-write cycle.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 2 is a pictorial view of a semiconductor package containing the device of FIG. 1;

FIGS. 3a and 3b are a timing diagram for the device of FIG. 1;

FIG. 4 is a block diagram of a microprocessor system using the device of FIG. 1;

FIG. 6 is a graphic representation of voltage or event vs. time in operation of the device of FIGS. 1 and 5.

DETAILED DESCRIPTION OF THE SPECIFIC EMBODIMENT

Figure 1:
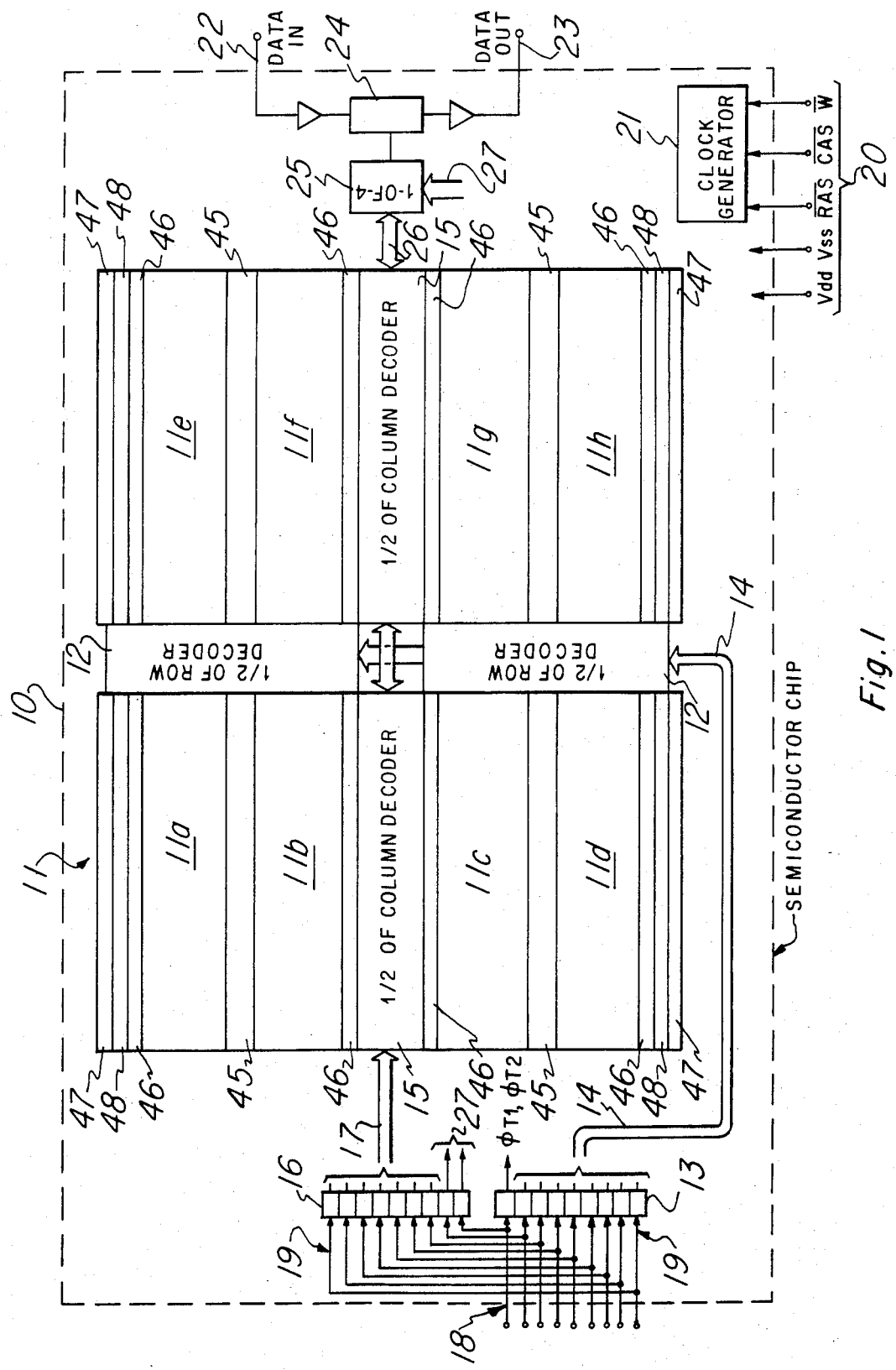
FIG. 1 as an electrical schematic diagram in block form of a semiconductor memory device employing features of the invention.

With reference to FIG. 1, a semiconductor memory device employing the invention is illustrated which is formed in a silicon chip 10 containing an array 11 of dynamic one-transistor memory cells. In this embodiment, the array contains "256K" or 262,144 cells, which if not partitioned would be a square array of 512×512 cells; the array is broken into eight arrays 11a–11h, however, with each of these containing 256 columns (256 pairs of bit line halves) with sixty-four cells per bit line half, or 2×256×64=32,768 cells. A row decoder 12 positioned between the arrays selects one row of 256 in each quadrant (4-of-1024 rows) based upon an 8-bit row address received from a set of row address buffers 13 by lines 14. A 4-of-1024 column select is performed by a Y decoder 15 which receives an eight bit column address from eight column buffers 16 via lines 17. A set of nine address input terminals 18 is connected to the row and column buffers 13 and 16 via lines 17. A set of nine address input terminals 18 is connected to the row and column buffers 13 and 16 by lines 19. The address is multiplexed; the row address is gated into the buffers 13 when a row address strobe signal $\overline{RAS}$ drops to zero, and the column address is gated into the buffers 15 when a column address strobe signal $\overline{CAS}$ drops to zero. The $\overline{RAS}$ and $\overline{CAS}$ signals are applied to the chip by terminals 20 along with a read/write control $\overline{W}$, all these signals being connected to a clock generator 21 which produces all of the internal clocks. A supply voltage Vdd, usually +5v dc., and ground Vss are also applied to the chip 10 by external terminals 20. A single-bit data input terminal 22 and a single-bit data output terminal 23 are connected to an I/O buffer and control circuit 24. A one-of-four column selector 25 connects the I/O control 24 to one of the four sets of dual-rail I/O lines 26 coming from the column decoder. This selector 25 receives two column address bits from the buffers 16 by lines 27. The semiconductor chip 10 is mounted in a sixteen-pin dual-in-line package 28 as seen in FIG. 2. Bonding pads on the chip 10 are connected by wires to interior pads for the sixteen pins 29, in accordance with the standard practice; of course, plastic packages or chip carriers may be used instead of the ceramic package of FIG. 2.

Figure 3B:
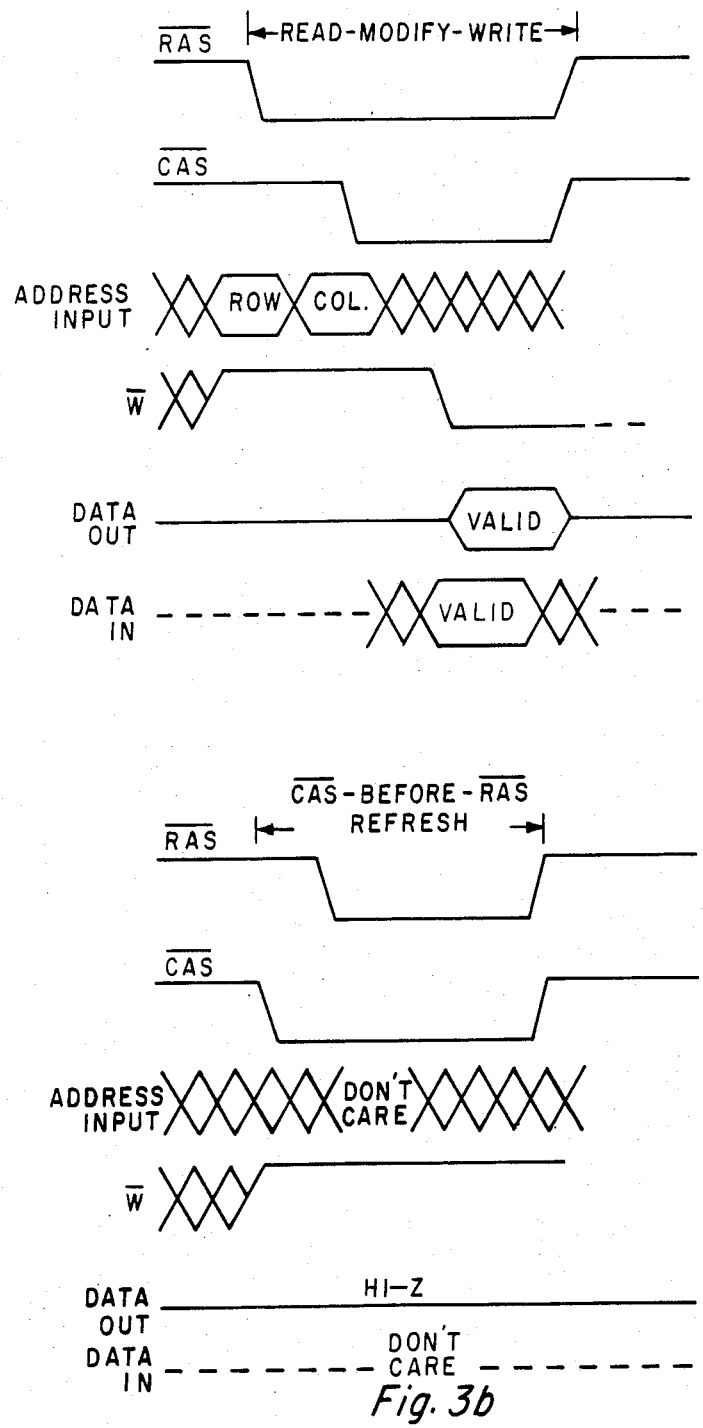

In FIG. 3 operations of the memory device are illustrated in a timing diagram. For a read operation, the $\overline{W}$ signal stays high, the address is valid on terminals 18 during the intervals shown, and data is valid on the output terminal 23 during a period after the $\overline{RAS}$ and $\overline{CAS}$ signals drop. At other times, the output buffer 24 holds the output terminal 23 in a high impedance state. A write operation is signalled by $\overline{W}$ going low, and in this case the data on input terminal 22 must be valid during the period indicated; the data output terminal 23 stays in the high impedence state. A page mode operation is defined when $\overline{RAS}$ stays low and $\overline{CAS}$ is cycled to gate in a sequence of column addresses. Although shown for read, the page mode operation can be a write instead. A read-modify-write operation occurs when the $\overline{W}$ signal drops after $\overline{CAS}$ goes low but before $\overline{RAS}$ and $\overline{CAS}$ go high, as seen in FIG. 3. A refresh operation occurs when $\overline{CAS}$ drops before $\overline{RAS}$, in which case an internal counter supplies a row address to the decoder 12 according to U.S. Pats. Nos. 4,207,618 and 4,344,157 issued to White and Rao, assigned to Texas Instruments; no column address is needed for refresh.

Referring to FIG. 4, a microprocessor system employing the memory device of FIG. 1 is illustrated. The microprocessor 30 which forms the CPU of the system may be, for example, a 9900 type made by Texas Instruments, a 6800 or 68000 type made by Motorola, or an 8600 type made by Intel. In this example, an eight bit data bus is discussed, although other architectures are appropriate, such as 16-bit. Eight of the chips 10 are used in parallel, providing a 256K-byte read/write memory. The eight memory chips 10 have the address terminals 18 coupled to a microprocessor 30 through a memory controller 31 and an address bus 32. The memory controller 31 is commercially available under part numbers TMS4050, MC0000 and the like, and functions to multiplex the addresses, generate $\overline{RAS}$ and $\overline{CAS}$, and to generate refresh addresses. The separate data-in and data-out terminals 22 and 23 of the chips 10 are coupled to the microprocessor 30 by conventional data latches 33 (part of memory controller) and an 8-bit bidirectional data bus 34. The control signal outputs 35 from the microprocessor 30 are usually designated data bus enable $\overline{DEN}$, memory enable $\overline{MEN}$, address latch ALATCH, address latch enable ALE, read RD, write WR, read/write R/W or W, valid memory address VMA, address strobe AS, data strobe DS, etc. depending upon the manufacturer and type or part number of the microprocessor. These are not the same as the control terminals of the devide 10 ($\overline{RAS}$, $\overline{CAS}$, $\overline{W}$). The control outputs 34 of the microprocessor or 38 are used to generate the controls $\overline{RAS}$, $\overline{CAS}$ and $\overline{W}$ for memory chips 10 and controls for the data latch 33 in the controller 31. A chip select control $\overline{CS}$ not shown, is usually generated external to the microprocessor by higher level address bits. In this example, however, the logical address range is assumed to be 18-bits, so the nine-bit row and column addresses are generated from the 18-bit address on the bus 32 by merely multiplexing. Likewise, the $\overline{CAS}$ before $\overline{RAS}$ refresh control may be generated externally, using a timer in the memory control, 31, or it may be controlled by the microprocessor 30.

The processor 30 contains an ALU 36, a register file 37 and an instruction register 38, with control decode circuitry 39 to generate internal command signals and memory controls 35 for defining the operation based on an instruction in the instruction register 38. A program counter 40 contains the address of the next instruction, and this address is sent out by address bus 32 to fetch the next instruction word from memory 10 to be delivered back to the instruction register 38 by data bus 34. The program counter is incremented after each fetch to produce the address of the next instruction, or a new address is used in case of a branch, vector interrupt, or other non-sequential fetch. In like manner, a memory address register 41 contains an address of data to be fetched from memory 10. An internal bus structure 42 couples the various elements together as in U.S. Pat. No. 3,757,306, assigned to Texas Instruments.

In FIG. 1, the array 256K-bit 11 is split into eight blocks 11a-11h; each containing 32K cells. Between each pair of blocks is positioned a set of 256 sense amplifiers 45 for a total of 1024 sense amplifiers, and each sense amplifier is multiplexed. Instead of one sense amplifier for each pair of bit line halves, each sense amplifier 45 is selectively connected to either of two pairs of bit line halves, one pair on the left or one pair on the right of a sense amplifier. Rows of dummy cells 46 are positioned on the outer edges of the array blocks 11a-11h, furthest from the sense amplifiers 45. One set of precharge devices 47 and one set of active load devices 48 are used for each pair of blocks such as 11a and 11b; 11e and 11f, etc. Thus, the bit lines in array block 11b are precharged through the bit lines of block 11a and the sense amplifiers 45. Likewise, the four pairs of data I/O lines 26 and associated Y decode 15 are located only on the interior edges of array blocks 11b, 11c, 11f and 11g, so data is read from or written into the outer blocks 11a, 11d, 11e and 11h by passing through the sense amplifier and opposite bit line halves.

Figure 5:
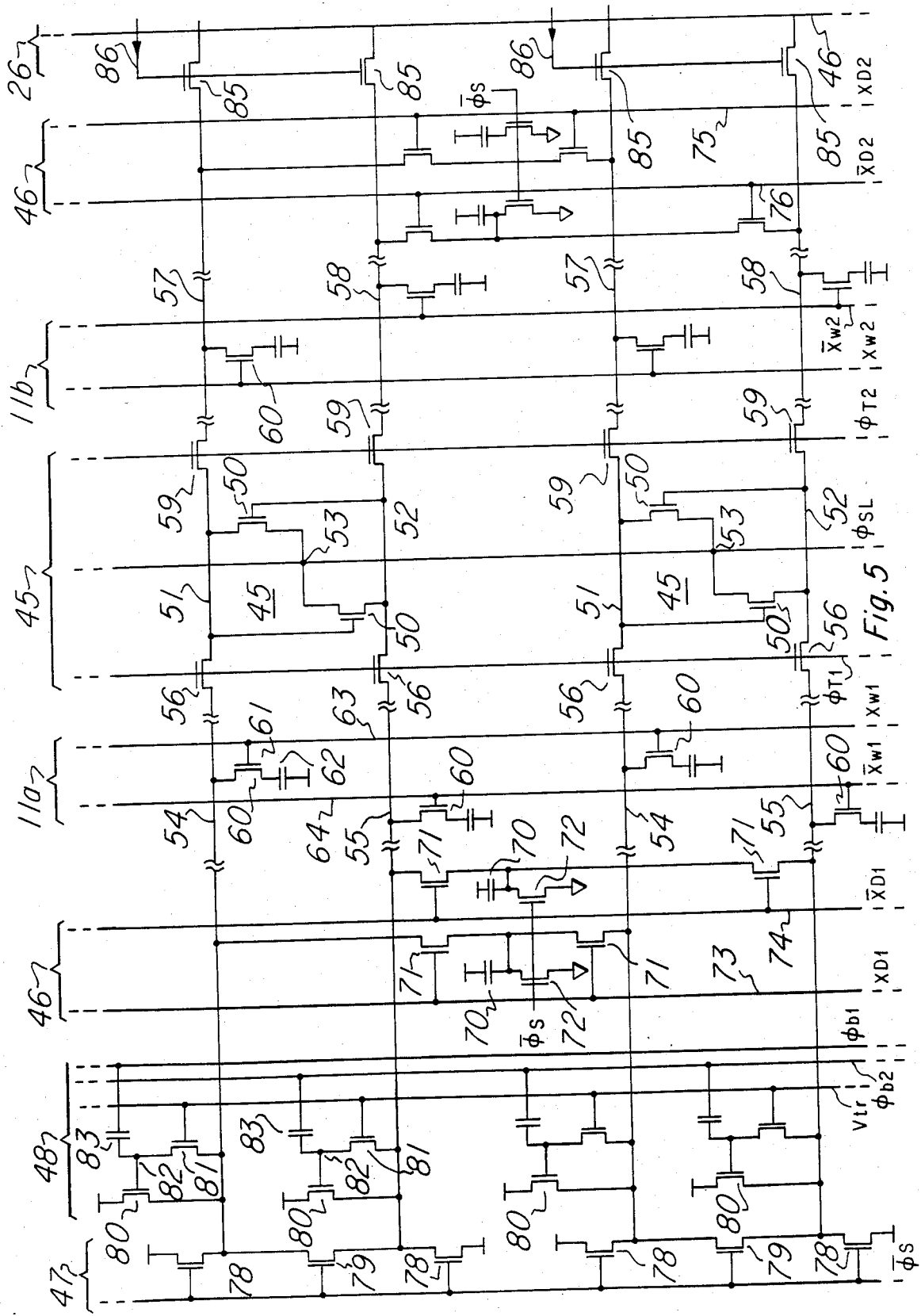
FIG. 5 is a detailed electrical diagram of the memory array circuitry of FIG. 1.

Referring to the detailed current diagram of FIG. 5, each sense amplifier 45 consists of a pair of cross-coupled driver transistors 50 which have their drains connected to sense nodes 51 and 52 and sources connected to a common grounding node 53. The nodes 51 and 52 are connected to a pair of bit line halves 54 and 55 on the left by a pair of transistors 56 or connected to a pair of bit line halves 57 and 58 on the right by a pair of coupling transistors 59. One-transistor type memory cells 60 are connected to the bit line halves 54, 55, 57, 58 as illustrated; each cell includes an access transistor 61 and a storage capacitor 62. These cells preferably use metal bit lines for higher conductivity as illustrated in U.S. patent application Ser. No. 133,376 filed Mar. 21, 1980, assigned to Texas Instruments. The gates of all sixty-four access transistors 61 in each row of cells are all connected to a row line 63 or 64 on the left (or 65 or 66 on the right). There are sixty-four of the cells 60 connected to each bit line half 54, 55, etc., although only one is shown. Thus there are sixty-four row lines 63, and sixty-four row lines 64 in array block 11a. The circuit seen in FIG. 5 has two sense amplifiers and four pairs of bit line halves 54 and 55, but it will be understood that each pair of blocks such as 11a and 11b contains 256 of the sense amplifiers 45; each block such as 11a has 256 pairs of bit line halves 54 and 55, along with 128 row lines 63 and 64.

The rows 46 of dummy cells consist of shared capacitors 70 which are full sized, i.e., the same size as the storage capacitors 62. The capacitors 70 are connected to two corresponding bit line halves such as 54 or 55 in adjacent columns by access transistors 71. The dummy capacitors 70 are predischarged by transistors 72 having the precharge clock $\overline{\Phi}s$ applied to their gates. The gates of the access transistors 71 for the dummy cell row for the bit lines 54 are connected to a dummy row address line 73, whereas the access transistors 71 for the dummy cells for lines 55 are connected to a dummy address line 74. Correspondingly, on the right-hand side, dummy cell address lines 75 and 76 are connected to the rows of dummy cell transistors. The row decoder 12 selects one of the four dummy cell address lines 73, 74, 75 or 76 depending upon which of the row address lines 63, 64, 65 or 66 is selected. For example, if the cell 60 to be read is on the upper left, the row line 63 will go high (XW1 goes high) and dummy address line 73 goes high (XD1). In this case, the sense node 51 is connected to bit line half 54 and receives the bit stored in the memory cell capacitor 62, whereas the dummy capacitor 70 is connected to the bit line half 55. The capacitance 70 is shared by two bit line halves 55, so each will drop by half the magnitude caused by a stored zero in a storage cell capacitor 62; the line 74 must go low before the latching operating begins so that the voltage on the other bit line half from the adjacent column will not influence the selected bit line.

The bit line halves 54, 55, 57 and 58 are all precharged from the left-hand side by transistors 78, and equalized by transistors 79, all of which have the precharge clock $\overline{\Phi s}$ on the gates. The transistors 56 and 59 are all turned on by clocks $\Phi T1$ and $\Phi T2$ which are both above Vdd during the precharge part of the cycle, so the bit line halves 57 and 58 on the right can be precharged and equalized from these circuits 47 on the far left.

In like manner, active pull-up circuits 48 including load transistors 80 for each bit line are all located on one side of each pair of blocks of the array. These active loads provide a function as disclosed in U.S. Pat. No. 4,701,081 issued to White, McAdams and Redwine or U.S. Pat. No. 4,239,993, issued to McAlexander, White and Rao, both assigned to Texas Instruments. The gates of the load transistors 80 are coupled to the bit line halves 54 or 55 by the source-drain paths of transistors 81, and the gates of these transistors 81 have a trap voltage Vtr on their gates. The trap voltage is held at a level above Vdd during the precharge part of the cycle, then drops to a level of about two Vt below Vdd during the active part of the cycle in order to trap a voltage on the nodes 82 at the gates of the transistors 80. A boost clock $\Phi b$ is applied to these nodes 82 by MOS gated capacitors 83; this clock goes high when the latch operation is initiated in the latch transistors 50. The zero-going bit line half will have dropped low enough to discharge the node 82, so this load transistor 80 will not turn on when $\Phi b$ occurs (thus saving power) but for the one-going side the node 82 is boosted by $\Phi b$ to a level above Vdd so that this bit line half is pulled back up to Vdd by current through the load transistor 80.

The right-hand bit line halves 57 and 58 selected by the column address are connected to data and data bar lines 26 by transistors 85 which have the column decode output applied to the gates by lines 86. The column decoder 15 has sixty-four of the output lines 86 for each quadrant of the array 11, so for a given 9-bit Y address, one of 256 lines 86 goes high; all others stay low. Thus, two possible pairs of bit lines halves (54 and 55, or 57 and 58) are selected, and selection between these two pairs is by the $\Phi T1$, $\Phi T2$ clock. Thus, in a given cycle, one of 512 columns is ultimately coupled to the lines 46.

Placing the sense amplifiers 45 between two pairs of bit lines halves 54 and 55, or 57 and 58, and isolating the unused one during sensing effectively reduces the bit line capacitance by a factor of two, thus doubling the signal generated on the bit line halves. The isolation is accomplished by pulling either $\Phi T1$ or $\Phi T2$ to ground, leaving the other at its boosted level from the previous cycle.

Another advantage of placing the sense amplifier 45 between two pairs of bit line halves is that the I/O lines 46 are then connected to the end of one pair of bit line halves, so the capacitance of the bit line halves 57 and 58 then act as filter to attenuate any noise coupled from the column decoders 15 before the noise reaches the sense amplifier 45 itself. This filtering action enables the signal from the decoder 15 to come in sooner on the lines 86 during sensing without a tendency to disturb the latching action of the sense amplifier 45. Any decrease in this critical timing translates directly to a decrease in the access time of the device.

The dummy cell capacitors 70 are shared between adjacent bit line pairs, and this allows the dummy cell capacitance 70, thus layout size, to be equal to that of the storage capacitors 62. This, in turn, avoids patterning problems and differences between the storage and reference cells due to moat encroachment or field implant encroachment.

Placement of the rows of dummy cells 46 on the outside of the array blocks farthest from the sense amplifiers 15 speeds sensing since the adverse initial signal usually seen when reading a zero is greatly reduced.

Referring to FIG. 6, the timing waveforms for all significant clocks are shown for a read cycle. Notice the $\Phi T1$ and $\Phi T2$ waveforms, both of which are booted to above Vdd from the previous cycle. In this case, a cell on the left side of FIG. 5 is being read from, so $\Phi T2$ falls to ground to isolate the right hand bit line halves. The word lines are then turned on by XW1 or $\overline{XW1}$ and sensing begins as $\Phi SL$ falls. The dummy word lines 73, etc., are turned off as sensing is done. The dummy cells must be isolated since they are shared between bit-sense lines that could be reading opposite data.

As sensing is being completed $\Phi T2$ is brought back up to Vdd and equalized there with $\Phi T1$. This action begins to propagate the read data over the right hand bit line halves to the I/O lines 46. In FIG. 6, $\Phi T1$ and $\Phi T2$ are actively booted in the active portion of the cycle. This booting is not necessary, however, since $\Phi T1$ and $\Phi T2$ are self-booted by the bit lines as they are charged up to Vdd in the precharge portion of the cycle. This self-booting through the transfer devices 56 and 59 is the mechanism that allows for all four bit lines halves 54, 55, 57 and 58 to be precharged from the far left bit line halves. With $\Phi T1$ and $\Phi T2$ booted to above Vdd and a metal-bit-line architecture, the right halves are equalized and charged to Vdd quite easily through transistors 56 and 59.

The clocks $\Phi T1$ and $\Phi T2$ need not be actively booted for the read cycle. However, with the write-activated active load 48, $\Phi T1$ and $\Phi T2$ need not be booted for a write cycle either, since the active loads 48 can pull the bit-sense lines to the full Vdd level.

FIG. 6 also shows the waveforms for a read-write, or read-modify-write, cycle. Notice that the only difference between this and the read cycle is in the boost clock boost waveforms. When the write operation is started, $\Phi b$ is pulled to ground long enough for the sense amplifier 45 to be latched with the new data and then refired to pull the high bit line to a full Vdd level. For an early write cycle, $\Phi b$ will fall completely under write control and will therefore be pulsed only once. Activating the active loads 48 greatly reduces the burden on write timing and also on signal booting, since a full Vdd level for the left bit line halves need not be written completely from the I/O lines 46, which leaves only the column decode signal to be booted.

Another major advantage to using a write-activated active load 48 is in page mode operation. During consecutive write cycles in page mode, all bit line halves except the ones being accessed at that particular cycle are left floating. A high level could leak off significantly during the specified $\overline{RAS}$ maximum low time of ten microseconds. However, with the write-activated active loads 48, the active loads will provide an active hold-up for the high-side bit line halves, thereby eliminating the possibility of "weak" or degraded high level signals being written into the selected storage cells 60.

A dynamic differential sense amplifier has been described that is shared between pairs of bit line halves. Through the use of write-activated active loads 48, many of the traditional write timing problems associated with shared sense amplifiers have been avoided. With the appropriate timing clocks, it is possible to share not only the sense amplifiers 45 but also the precharge circuitry 47, active loads 48, and dummy cells 70, all of which save chip area, thus increasing density.

Most important, however, is the savings in speed of the device. Through the use of the write-activated active loads, the write timing and data propagation times have been significantly improved in critical areas. Also the access time has been improved slightly be enabling the column decoder signal on lines 86 to come up sooner, and also through the placement of the dummy cells on the outside of the array, which improves net sensing time.

The write-activated active load improves the critical write timings so that a write operation may be done in the same cycle time as a read operation.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A dynamic semiconductor memory device comprising:
   an array of rows and columns of memory cells, with all cells in each row connected to a row line and all cells in each column connected to a column line, each column line split into two column line halves, the two column line halves for each column being positioned side by side and the row lines being interleaved,
   a plurality of differential sense amplifiers, each sense amplifier having a pair of sense nodes.
   each sense amplifier being multiplexed for two separate columns by first and second pairs of coupling transistors, the first pair connecting the column line halves for one column to said sense nodes and the other pair connecting the column line halves for another column to said sense nodes;
   a pair of active pull-up load circuits for each sense amplifier, each said load circuit connected to one of the column line halves for said one column on one side of a sense amplifier but not connected to the other side of said sense amplifier;
   timing means to separately activate one pair of said first and second pairs of coupling transistors during a sensing period of a write cycle and also then to activate both the first and second pairs of coupling transistors during a later period of said write cycle;
   said timing means activating said pair of active pull-up load circuits during said later period of said write cycle.

2. A device according to claim 1 wherein input/output conductor means is coupled only to said column line halves for said another column on the opposite sides of the sense amplifier from said active pull-up load circuit.

3. A device according to claim 1 wherein a precharge and equalization circuit is connected to said column line halves on said one side of the sense amplifier but not on said other side.

4. A device according to claim 1 wherein said one column and said another column are positioned on opposite sides of the sense amplifier.

5. A dynamic semiconductor memory device comprising:
   an array of rows and columns of memory cells, with all cells in each row connected to a row line and all cells in each column connected to a column line, each column line split into two column line halves.
   a plurality of differential sense amplifiers, each sense amplifier having two inputs connected to the column line halves for a column:
   a pair of active pull-up load circuits for each sense amplifier, each said load circuit connected to one of the column line halves for said column;
   timing means to activate said load circuits at a first time during a read-write cycle, to deactivate said load circuits for a second time following said first time, then to activate said load circuits again at a third time after said second time during said read-write cycle.

6. A device according to claim 5 wherein input/output conductor means is coupled to said column line halves when said active pull-up load circuits are activated the second time but not the first time during said cycle.

7. A device according to claim 5 wherein a precharge and equallization circuit is also connected to said column line halves.

8. In a dynamic read/write memory device:
   a sense amplifier having a pair of differential sense nodes,
   first and second pairs of bit lines, each bit line having a plurality of one-transistor memory cells coupled thereto,
   first and second pairs of coupling means for selectively connecting said sense nodes to said first and second pairs of bit lines,
   a pair of data I/O lines selectively coupled to said first pair of bit lines,
   a pair of active pull-up circuits coupled to said second pair of bit lines,
   means for activating one of said memory cells on one of the first or the second pair of bit lines, but not both, in response to an address, at a first time in an operating cycle,
   means for deactivating said coupling means for the other of the first or second pair of bit lines prior to said first time, selected by said address,
   means for activating said sense amplifier at a second time in said cycle, after said first time,
   means for activating said coupling means for the other of the first and second pairs of bit lines at a third time, after second time,
   means for activating said pair of active pull-up circuits at a fourth time in said cycle, after said third time.

9. In a device according to claim 8, means for precharging and equalizing coupled to said second pair of bit lines and activated in a precharge cycle prior to said operating cycle.

10. In a device according to claim 8, means responsive to another address for connecting said first pair of bit lines to said pair of data I/O lines.

11. In a device according to claim 10, said bit lines of the first pair being physically located on one side of the sense amplifier, and said bit lines of the second pair being physically located on the other side of the sense amplifier.

12. A device according to claim 10 wherein said means for activating said pair of active pull-up circuits also deactives and reactivates said active pull-up circuits in said cycle after said fourth time, in a write operation.

* * * * *